(12) United States Patent
Shirakawa et al.

(10) Patent No.: US 11,574,999 B2
(45) Date of Patent: Feb. 7, 2023

(54) SEMICONDUCTOR DEVICE

(71) Applicant: FUJI ELECTRIC CO., LTD., Kanagawa (JP)

(72) Inventors: Tohru Shirakawa, Matsumoto (JP); Yasunori Agata, Matsumoto (JP); Kaname Mitsuzuka, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 79 days.

(21) Appl. No.: 17/329,205

(22) Filed: May 25, 2021

(65) Prior Publication Data
US 2022/0013628 A1 Jan. 13, 2022

(30) Foreign Application Priority Data

Jul. 10, 2020 (JP) .............................. JP2020-119493

(51) Int. Cl.
*H01L 29/06* (2006.01)
*H01L 29/739* (2006.01)
*H01L 29/08* (2006.01)

(52) U.S. Cl.
CPC ...... *H01L 29/0626* (2013.01); *H01L 29/0623* (2013.01); *H01L 29/0696* (2013.01); *H01L 29/0821* (2013.01); *H01L 29/7397* (2013.01)

(58) Field of Classification Search
CPC ............. H01L 29/0626; H01L 29/0623; H01L 29/0696; H01L 29/0821; H01L 29/7397
USPC .......................................................... 257/139
See application file for complete search history.

(56) References Cited

U.S. PATENT DOCUMENTS

2018/0182844 A1* 6/2018 Nakamura .......... H01L 29/7397
2019/0006494 A1 1/2019 Matsudai

FOREIGN PATENT DOCUMENTS

JP 2018133493 A 8/2018
JP 2019012725 A 1/2019

\* cited by examiner

*Primary Examiner* — Igwe U Anya

(57) ABSTRACT

Provided is a semiconductor device comprising an active region and an edge region, the semiconductor device comprising: a drift region of a first conductivity type provided in the semiconductor substrate; a base region of a second conductivity type provided above the drift region; a first collector region of the second conductivity type provided below the drift region in the active region; and a second collector region of the second conductivity type provided below the drift region in the edge region, wherein a doping concentration of the first collector region is higher than a doping concentration of the second collector region, wherein an area of the first collector region is of the same size as an area of the second collector region or larger than the area of the second collector region, in a top plan view.

20 Claims, 12 Drawing Sheets

SEMICONDUCTOR DEVICE

The contents of the following Japanese patent applications are incorporated herein by reference:
No. 2020-119493 filed in JP on Jul. 10, 2020.

BACKGROUND

1. Technical Field

The present invention relates to a semiconductor device.

2. Related Art

Conventionally, in the insulated gate bipolar transistor (IGBT) or the like, a semiconductor device comprising an active region and an edge region (terminating structure portion) is known (for example, see Patent Document 1 or 2).

[Patent Document 1] Japanese Patent Application Publication No. 2018-133493
[Patent Document 2] Japanese Patent Application Publication No. 2019-12725

DESCRIPTION OF EXEMPLARY EMBODIMENTS

Figure 1A:
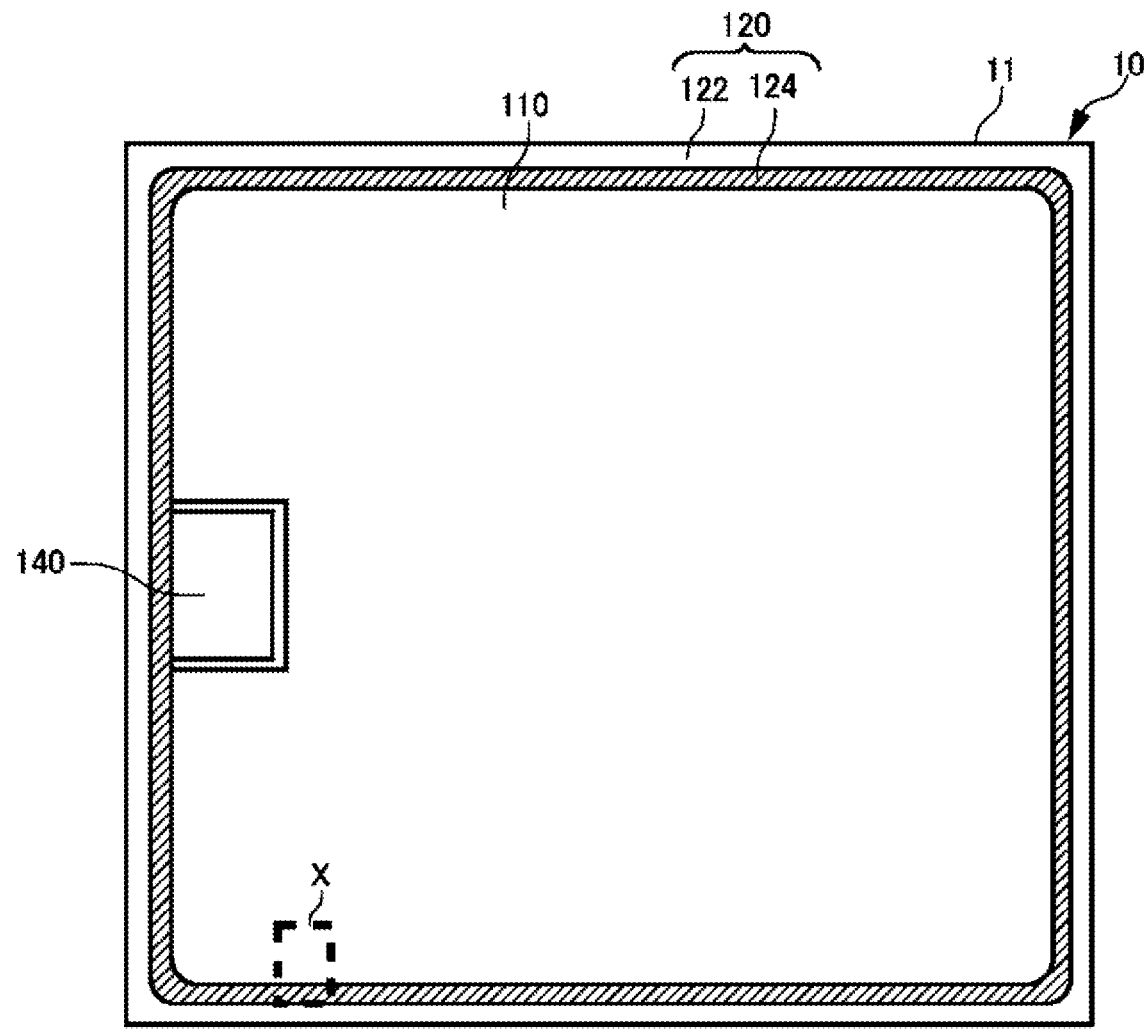
FIG. 1A shows one example of a top plan view of a semiconductor device 100.

Hereinafter, the present invention will be described through embodiments of the invention, but the following embodiments do not limit the claimed invention. In addition, not all combinations of features described in the embodiments necessarily are essential to solving means of the invention.

Herein, one side in the direction parallel to the depth direction of the semiconductor substrate is referred to as "front" or "upper", and the other side is referred to as "back" or "lower". One surface of two principal surfaces of a substrate, a layer, or another member is referred to as an upper surface, and the other surface is referred to as a lower surface. The directions indicated by "front", "upper", "back", and "lower" are not limited to the gravitational direction or the directions at the time of implementation of the semiconductor device.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. In a case where the Z axis direction is described without a description of positive and negative signs, the direction means a direction parallel to the +Z axis and the −Z axis. Further, in the present specification, a case of viewing from the +Z axis direction may be referred to as the top plan view.

In the present specification, an expression such as "same" or "equal" may include the case which has an error due to a variation in manufacturing or the like. The error is, for example, within 10%.

In the present specification, the conductivity type of a doping region doped with impurities is described as a P type or an N type. Note that conductivity types of respective doping regions may be of opposite polarities, respectively. Further, in the present specification, a description of a P+ type or an N+ type means a higher doping concentration than that of the P type or the N type, and a description of a P− type or an N− type means a lower doping concentration than that of the P type or the N type.

In the present specification, the doping concentration refers to a concentration of an impurity activated as a donor or an acceptor. In the present specification, a concentration difference between a donor and an acceptor may be a concentration of a majority between the donor and the acceptor. The concentration difference can be measured by the Capacitance-Voltage method (CV method). Further, a carrier concentration measured by Spreading Resistance (SR) profiling may be set as the concentration of the donor or the acceptor. Further, when a concentration distribution of the donor or the acceptor has a peak in a region, a value of the peak may be set as the concentration of the donor or the acceptor. In a case where the concentration of the donor or the acceptor is substantially uniform in the region where the donor or the acceptor is present or the like, the average value of the donor concentration or the acceptor concentration in the region may be set as the donor concentration or the acceptor concentration.

FIG. 1A shows one example of the top plan view of a semiconductor device 100. The semiconductor device 100 is a semiconductor chip including a transistor portion. The semiconductor device 100 includes a semiconductor substrate 10 in which an active region 110 and an inactive region 120 are formed.

The semiconductor substrate 10 is a substrate formed of a semiconductor material such as silicon, silicon carbide, or gallium nitride. The semiconductor substrate 10 may include a portion formed by epitaxial growth or the like. The semiconductor substrate 10 in the present example is a silicon substrate.

The active region 110 is a region in which main current flows between a front surface 21 and a back surface 23 of the semiconductor substrate 10 when the semiconductor device 100 is controlled to be an ON state. In other words, the active region 110 is a region in which the current flows through the interior of the semiconductor substrate 10 from the front surface 21 to the back surface or from the back surface 23 to the front surface 21 of the semiconductor substrate 10 in the depth direction. An IGBT is formed in the active region 110 in the present example.

The inactive region 120 is a region between the active region 110 and an outer peripheral end 11 of the semiconductor substrate 10 in the top plan view. The inactive region 120 includes an edge region 122 and an intermediate region 124. In the inactive region 120, one or more metal pads may be arranged for connecting the semiconductor device 100 and an external device via a wire or the like.

The edge region 122 is a region between the active region 110 and the outer peripheral end 11 of the semiconductor substrate 10. The edge region 122 is provided to surround the active region 110 in the top plan view. Note that the edge region 122 may have an edge terminating structure portion. The edge terminating structure portion relaxes the electric field concentration on the upper surface side of the semiconductor substrate 10. The specific structure of the edge region 122 will be described below.

The intermediate region 124 is provided between the active region 110 and the edge region 122 in the top plan view. The intermediate region 124 in the present example surrounds the outer periphery of the active region 110 in the top plan view. The intermediate region 124 includes a gate metal layer 50 as described below.

A gate pad 140 is electrically connected with a gate conductive portion of the active region 110 via the gate metal layer 50. The gate pad 140 may be in contact with the gate metal layer 50. The gate pad 140 is set to a gate potential. The gate pad 140 in the present example has a rectangular shape in the top plan view.

Figure 1B:
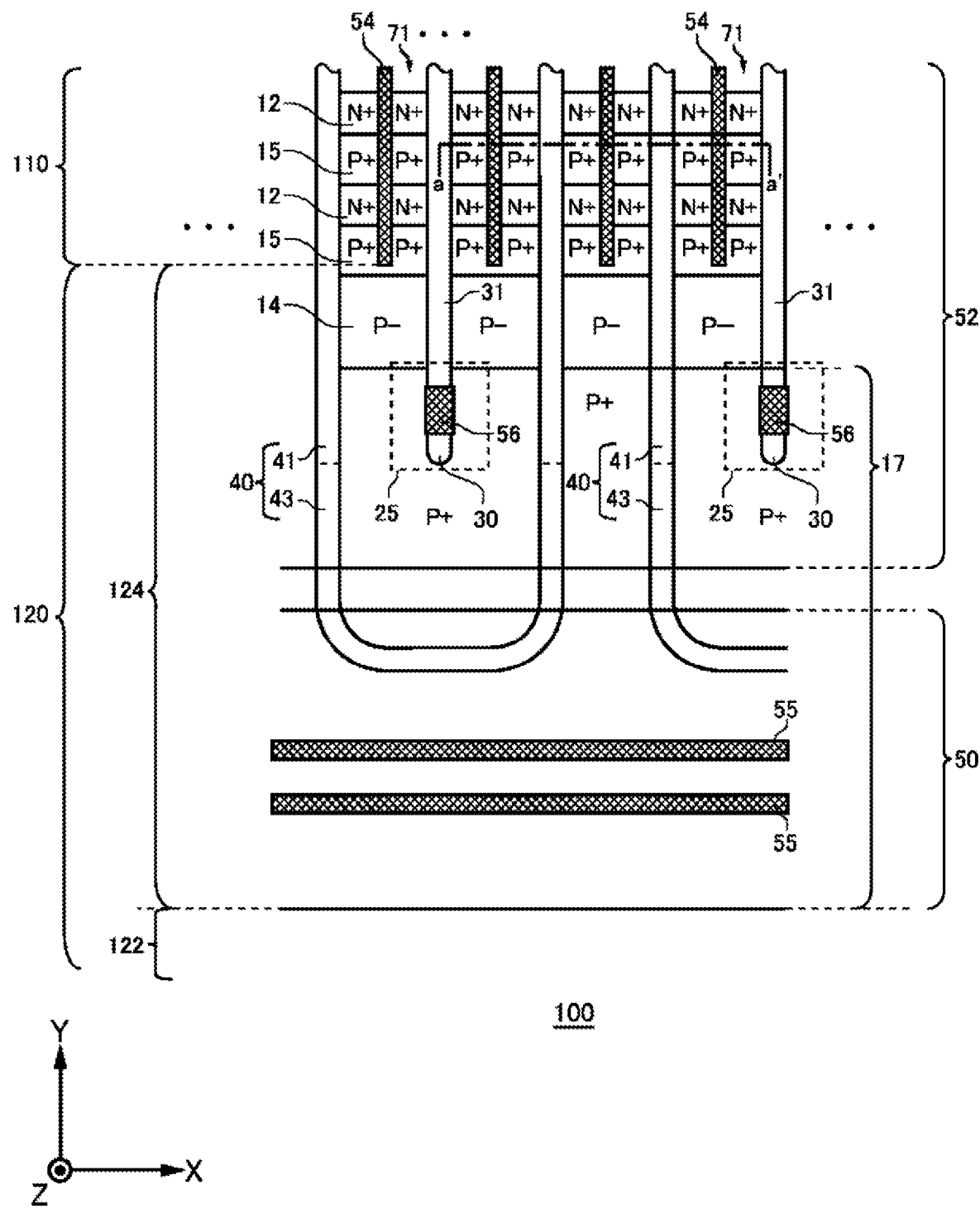
FIG. 1B shows one example of a top plan view of the semiconductor device 100.

FIG. 1B shows one example of the top plan view of the semiconductor device 100. In the present example, FIG. 1B shows an enlarged view of the region X in FIG. 1A.

The semiconductor device 100 in the present example includes a gate trench portion 40, a dummy trench portion 30, an emitter region 12, a base region 14, a contact region 15, and a well region 17, in the front surface of the semiconductor substrate 10. Also, the semiconductor device 100 of the present example includes an emitter electrode 52 and the gate metal layer 50, which are provided above the front surface of the semiconductor substrate 10.

The emitter electrode 52 is provided above the gate trench portion, the dummy trench portion, the emitter region, the base region, the contact region 15, and the well region 17. The emitter electrode 52 may be connected with an electrode external to the semiconductor device 100 by wire boding or the like. For example, the electrode external to the semiconductor device 100 may be an anode electrode of a diode or an electrode of a integrated circuit arranged adjacent to the semiconductor device 100, an electrode provided in a substrate having the semiconductor device 100 mounted thereon or the like, or an external terminal provided in a resin case incorporating a substrate having the semiconductor device 100 mounted thereon or the like, etc.

The gate metal layer 50 is provided above the gate trench portion 40 and the well region 17. The gate metal layer 50 is electrically connected with the gate conductive portion of the active region 110, and supplies the gate voltage. The gate metal layer 50 is electrically connected with the gate pad 140. The gate metal layer 50 is provided to surround the outer periphery of the active region 110 in the top plan view. The gate metal layer 50 may be provided along the intermediate region 124 between the active region 110 and the edge region 122.

The emitter electrode 52 and the gate metal layer 50 are formed of a material including metal. For example, at least a partial region of the emitter electrode 52 may be formed of aluminum, aluminum-silicon alloy, or aluminum-silicon-copper alloy. At least a partial region of the gate metal layer 50 may be formed of aluminum, aluminum-silicon alloy, or aluminum-silicon-copper alloy. The emitter electrode 52 and the gate metal layer 50 may include a barrier metal formed of titanium, titanium compound, or the like under the region formed of aluminum or the like. The emitter electrode 52 and the gate metal layer 50 are provided separately from each other.

The emitter electrode 52 and the gate metal layer 50 are provided above the semiconductor substrate 10 to sandwich an interlayer dielectric film 38. The interlayer dielectric film 38 is omitted in FIG. 1B. A contact hole 55 and a contact hole 56 are provided through the interlayer dielectric film 38.

The contact hole 55 connects the gate metal layer 50 with the gate conductive portion in the active region 110.

A plug 57, which will be described below, formed of tungsten or the like may be formed in the interior of the contact hole 55 via a barrier metal layer 53.

The contact hole 56 connects the emitter electrode 52 with the dummy conductive portion in the dummy trench portion 30. A plug 57 formed of tungsten or the like may be formed in the interior of the contact hole 56 via the barrier metal layer 53.

A connecting portion 25 electrically connects the emitter electrode 52 or a front surface side electrode of the gate metal layer 50 or the like with the semiconductor substrate 10. In one example, the connecting portion 25 is provided between the gate metal layer 50 and the gate conductive portion. The connecting portion 25 is also provided between the emitter electrode 52 and the dummy conductive portion. The connecting portion 25 is formed of a conductive material such as polysilicon doped with impurities. Herein, the connecting portion 25 is polysilicon (N+) doped with N type impurities. The connecting portion 25 is provided above the front surface of the semiconductor substrate 10 via an dielectric film such as an oxide film, or the like.

The gate trench portion 40 is arranged at a predetermined interval along a predetermined arrangement direction (in the present example, the X axis direction). The gate trench portion 40 in the present example may have two extending portions 41 extending along the extending direction (in the present example, the Y axis direction) that is parallel to the front surface of the semiconductor substrate 10 and perpendicular to the arrangement direction and a connecting portion 43 connecting the two extending portions 41.

At least a part of the connecting portion 43 is preferably formed in a curved shape. By connecting end portions of the two extending portions 41 of the gate trench portion 40 to each other, the electric field concentration at the end portions of the extending portions 41 can be relaxed. At the connecting portion 43 of the gate trench portion 40, the gate metal layer 50 may be connected with the gate conductive portion.

The dummy trench portion 30 is a trench portion electrically connected with the emitter electrode 52. Similarly to the gate trench portion 40, the dummy trench portion 30 is arranged at a predetermined interval along a predetermined arrangement direction (in the present example, the X axis direction). The dummy trench portion 30 in the present example has an extending portion 31 extending along the extending direction. Note that, similarly to the gate trench portion 40, the dummy trench portion 30 may have a U shape in the front surface of the semiconductor substrate 10.

In other words, the dummy trench portion 30 may have two extending portions 31 extending along the extending direction and a connecting portion connecting the two extending portions 31.

The semiconductor device 100 in the present example has a structure in which two gate trench portions 40 and one dummy trench portions 30 are repeatedly arranged. In other words, the semiconductor device 100 in the present example has the gate trench portions 40 and the dummy trench portions 30 at a ratio of 2:1. For example, the semiconductor device 100 has one extending portion 31 between two extending portions 41.

Note that the ratio of the gate trench portions 40 and the dummy trench portions 30 is not limited to the present example. The ratio of the gate trench portion 40 to the dummy trench portion 30 may be 1:1 or may be 1:2. Moreover, the dummy trench portion 30 may be not provided in the semiconductor device 100, and all that is provided may be the gate trench portion 40.

The well region 17 is a region of a second conductivity type provided closer to the front surface of the semiconductor substrate 10 than the drift region 18, which will be described below. The well region 17 is one example of a well region provided on the inactive region 120 side of the semiconductor device 100. The well region 17 may have a higher doping concentration than that of the base region 14. The well region 17 is of the P+ type, as one example. The well region 17 is formed within a predetermined range to extend, from the end of the active region 110 on the side where the gate metal layer 50 is provided, to the inactive region 120. A diffusion depth of the well region 17 may be deeper than depths of the gate trench portion 40 and the dummy trench portion 30. Partial regions of the gate trench portion 40 and the dummy trench portion 30 on the gate metal layer 50 side is formed in the well region 17. The bottoms at the end of the extending direction of the gate trench portion 40 and the dummy trench portion 30 may be covered by the well region 17.

The contact hole 54 is formed above each of the emitter region 12 and the contact region 15 in a mesa portion 71. The contact hole 54 is not provided above the well region 17 provided at both ends of the Y axis direction. In this way, one or plurality of contact holes 54 are formed in the interlayer dielectric film. The one or plurality of contact holes 54 may be provided to extend in the extending direction.

The mesa portion 71 is a region provided adjacent to the trench portion in the plane parallel to the front surface of the semiconductor substrate 10. The mesa portion 71 may be a portion of the semiconductor substrate 10 sandwiched between two adjacent trench portions, which is located from the front surface of the semiconductor substrate 10 to the depth of the deepest bottom portion of each trench portion. The extending portions of each trench portion may be regarded as one trench portion. In other words, the region sandwiched between two extending portions may be regarded as a mesa portion. The mesa portion 71 has the well region 17, the emitter region 12, the base region 14, and the contact region 15, in the front surface of the semiconductor substrate 10. In the mesa portion 71, the emitter region 12 and the contact region 15 are provided alternately in the extending direction.

The base region 14 is a region of the second conductivity type provided on the front surface side of the semiconductor substrate 10. The base region 14 is of the P− type, as one example. The base region 14 may be provided at both end portions of the mesa portion 71 in the Y axis direction, in the front surface of the semiconductor substrate 10. Note that FIG. 1B shows only one end of the base region 14 in the Y axis direction.

The emitter region 12 is a region of the first conductivity type having a higher doping concentration than that of the drift region 18. The emitter region 12 in the present example is of N+ type, as one example. One example of a dopant of the emitter region 12 is arsenic (As). The emitter region 12 is provided in contact with the gate trench portion 40 in the front surface of the mesa portion 71. The emitter region 12 may be provided to extend in the X axis direction from one of two trench portions sandwiching the mesa portion 71 to the other of the two trench portions. The emitter region 12 is also provided below the contact hole 54. Moreover, the emitter region 12 may be or may not be in contact with the dummy trench portion 30. The emitter region 12 in the present example is in contact with the dummy trench portion 30.

The contact region 15 is a region of the second conductivity type having a higher doping concentration than that of the base region 14. The contact region 15 in the present example is of the P+ type, as one example. The contact region 15 in the present example is provided in the front surface of the mesa portion 71. The contact region 15 may be provided in the X axis direction from one of two trench portions sandwiching the mesa portion 71 to the other of the two trench portions. The contact region 15 may be or may not be in contact with the gate trench portion 40. Moreover, the contact region 15 may be or may not be in contact with the dummy trench portion 30. In the present example, the contact region 15 is in contact with the dummy trench portion 30 and the gate trench portion 40. The contact region 15 is also provided below the contact hole 54.

The active region 110 includes a region where the emitter region 12 and the contact region 15 are repeatedly arranged. The active region 110 also includes the dummy trench portion 30 and the gate trench portion 40. The end of the active region 110 in the Y axis direction is an end of a region where the emitter electrode 52 is connected with the semiconductor substrate 10 via the contact hole 54. In the present example, the end of the contact hole 54 is located above the contact region 15.

The edge region 122 is a region closer to the outer peripheral end 11 than the gate metal layer 50 in the top plan view. The boundary between the edge region 122 and the intermediate region 124 in the present example is the end of the gate metal layer 50 on the negative side of the Y axis direction. The specific structure of the edge region 122 will be described below.

The intermediate region 124 is a region between the active region 110 and the edge region 122 in the top plan view. In the intermediate region 124, the emitter electrode 52 may not be electrically connected with the semiconductor substrate 10. Note that, in the intermediate region 124, the emitter electrode 52 may be electrically connected with the dummy conductive portion of the dummy trench portion 30.

Figure 1C:
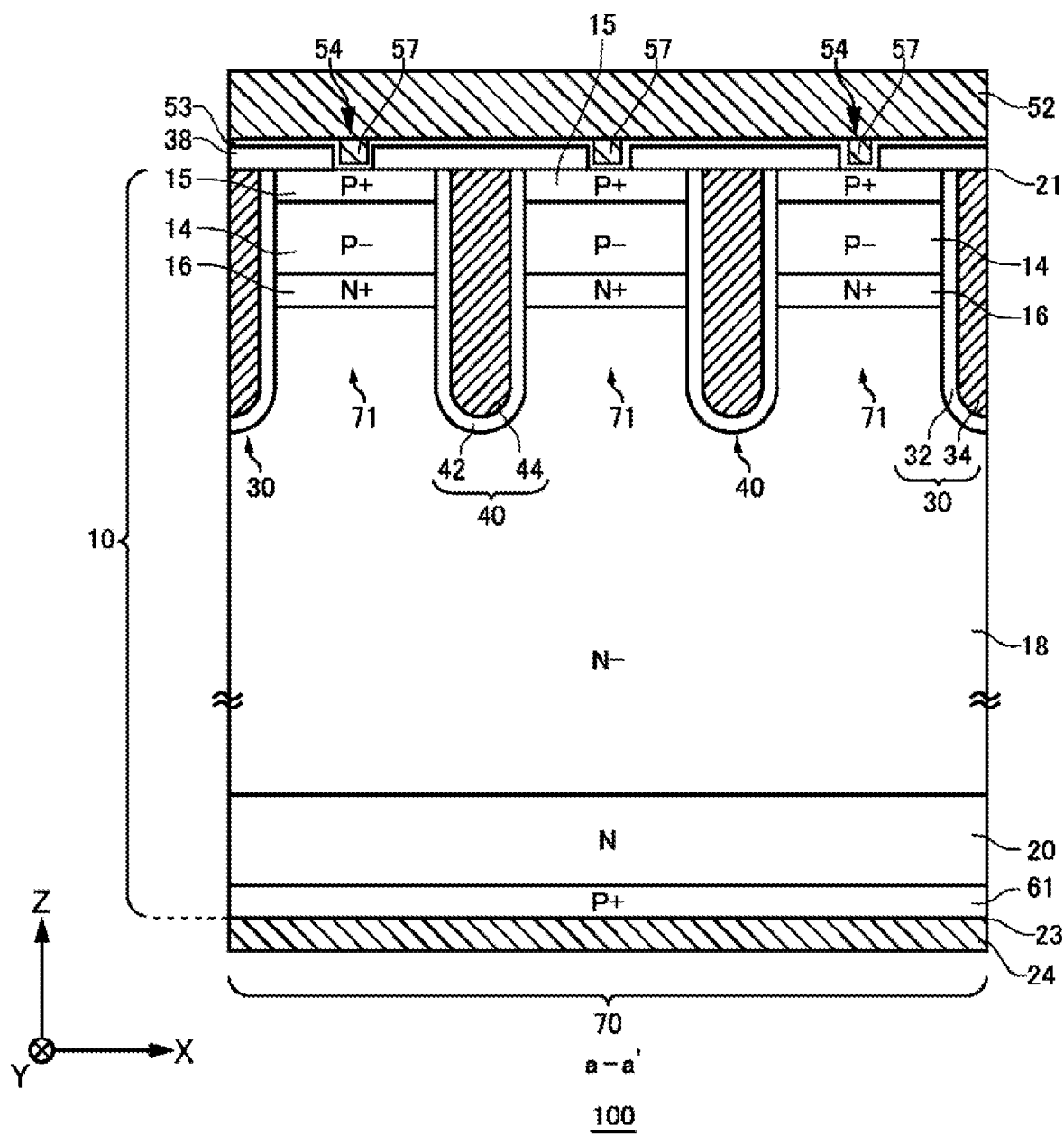
FIG. 1C is a view showing one example of the cross section a-a' in FIG. 1B.

FIG. 1C is a view showing one example of the cross section a-a' in FIG. 1B. The cross section a-a' is an XZ plane passing through the contact region 15 in the mesa portion 71. In the cross section a-a', the semiconductor device 100 of the present example has the semiconductor substrate, the interlayer dielectric film, the emitter electrode 52, and a collector electrode 24. The emitter electrode 52 is formed above the semiconductor substrate 10 and the interlayer dielectric film 38.

The drift region 18 is a region of the first conductivity type provided in the semiconductor substrate 10. The drift region 18 in the present example is of the N− type, as one example. The drift region 18 may be a remaining region where another doping region is not formed in the semiconductor substrate 10. In other words, the doping concentration of the drift region 18 may be a doping concentration of the semiconductor substrate 10. The emitter region 12, the contact region 15, and the accumulation region 16 are provided above the drift region 18. A buffer region 20 and a first collector region 61 are provided below the drift region 18.

The buffer region 20 is a region of the first conductivity type provided below the drift region 18. The buffer region 20 in the present example is of the N type, as one example. The doping concentration of the buffer region 20 is higher than the doping concentration of the drift region 18. The buffer region 20 may function as a field stop layer for preventing a depletion layer extending from the lower surface side of the base region 14 from reaching the first collector region 61 of the second conductivity type.

The first collector region 61 is a region of the second conductivity type provided below the drift region 18 in the active region 110. The first collector region 61 is of the P+ type, as one example. For example, the doping concentration of the first collector region 61 is 1E16 cm$^{-3}$ or more and 5E18 cm$^{-3}$ or less. As one example, the doping concentration of the first collector region 61 is 8E17 cm$^{-3}$. Note that, the E means a power of 10 and, for example, 8E17 cm$^{-3}$ means $8\times10^{17}$ cm$^{-3}$. The first collector region 61 is provided below the buffer region 20.

The collector electrode 24 is formed on the back surface 23 of the semiconductor substrate 10. The collector electrode 24 is formed of a conductive material such as metal. The collector electrode 24 is in contact with the first collector region 61.

The accumulation region 16 is a region of the first conductivity type provided closer to the front surface 21 of the semiconductor substrate 10 than the drift region 18. The accumulation region 16 in the present example is of the N+ type, as one example. The accumulation region 16 in the present example is provided in contact with the gate trench portion 40. The doping concentration of the accumulation region 16 is higher than the doping concentration of the drift region 18. By providing the accumulation region 16, the carrier injection enhancement effect (IE effect) can be increased and the ON voltage of the active region 110 can be decreased.

The gate trench portion 40 has a gate trench, a gate dielectric film 42 and a gate conductive portion 44 that are formed in the front surface 21. The gate dielectric film 42 is formed to cover an inner wall of the gate trench. The gate dielectric film 42 may be formed by oxidizing or nitriding a semiconductor on the inner wall of the gate trench. The gate dielectric film 42 is formed in the interior of the gate trench, and the gate conductive portion 44 is formed inside the gate dielectric film 42. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 in the front surface 21.

The gate conductive portion 44 includes a region opposing the adjacent base region 14 on the mesa portion 71 side by sandwiching the gate dielectric film 42, in the depth direction of the semiconductor substrate 10. When a predetermined voltage is applied to the gate conductive portion 44, electrons gather in the front layer of the interface of the base region 14 in contact with the gate trench to form a channel by an N type inversion layer so as to cause flow of current.

The dummy trench portion 30 may have the same structure as that of the gate trench portion 40. The dummy trench portion 30 has a dummy trench, a dummy dielectric film 32 and a dummy conductive portion 34 that are formed in the front surface 21. The dummy dielectric film 32 is formed covering the inner walls of the dummy trench. The dummy conductive portion 34 is formed in the interior of the dummy trench and the dummy conductive portion 34 is formed inside the dummy dielectric film 32. The dummy dielectric film 32 insulates the dummy conductive portion 34 from the semiconductor substrate 10. The dummy trench portion 30 is covered by the interlayer dielectric film 38 in the front surface 21.

The interlayer dielectric film 38 is provided in the front surface 21. The emitter electrode 52 is provided above the interlayer dielectric film 38. In the interlayer dielectric film 38, one or plurality of contact holes 54 are provided for electrically connecting the emitter electrode 52 with the semiconductor substrate 10. The contact hole 55 and the contact hole 56 may also be provided through the interlayer dielectric film 38.

Figure 2:
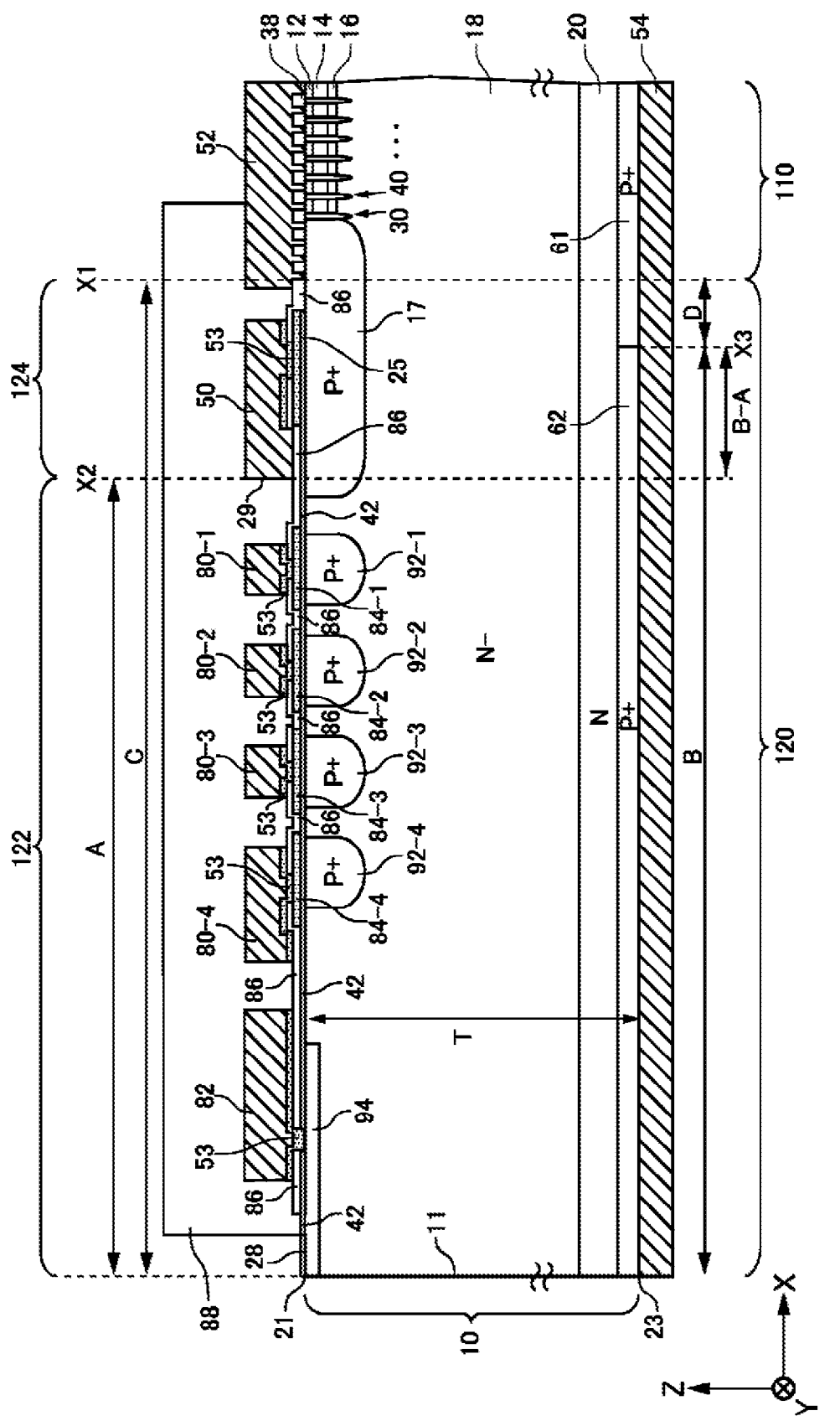
FIG. 2 is a cross sectional view showing one example of a configuration of the semiconductor device 100.

FIG. 2 is a cross sectional view showing one example of a configuration of the semiconductor device 100. In the present example, the plane parallel to the upper surface of the semiconductor substrate 10 is referred to as the XY plane, and the depth direction of the semiconductor substrate 10 is referred to as the Z axis. FIG. 2 shows a partial cross sectional view including a portion of the active region 110, the edge region 122 between the portion of the active region 110 and the outer peripheral end 11 of the semiconductor substrate 10. As one example, the active region 110 has a larger width than that of the edge region 122 in the X axis direction and the Y axis direction, and is surrounded by the edge region 122 in the XY plane. An end 29 of the gate metal layer 50 on the outer peripheral end 11 side is provided along the boundary between the edge region 122 and the intermediate region 124.

A part of the first collector region 61 may be provided to extend from the active region 110 to the intermediate region 124 in the top plan view. A part of the first collector region 61 may be provided to extend from the active region 110 to the edge region 122 in the top plan view. As one example, the first collector region 61 may be provided to extend from the active region 110 to the inactive region 120 by 10 μm or more, or 20 μm or more. The distance the first collector region 61 extends to the inactive region 120 may be within 40 μm.

A second collector region 62 is a region of the second conductivity type provided below the drift region 18. The second collector region 62 is provided below the buffer region 20. At least a part of the second collector region 62 is provided in the edge region 122. The second collector region 62 is provided closer to the outer peripheral end 11 than the first collector region 61 in the top plan view. For example, the doping concentration of the second collector region 62 is 1E16 cm$^{-3}$ or more and 5E18 cm$^{-3}$ or less.

The doping concentration of the first collector region 61 is higher than the doping concentration of the second collector region 62. In one example, the doping concentration of the second collector region 62 is 0.85 times or less than the doping concentration of the first collector region 61. Note that the concentration difference between the first collector region 61 and the second collector region 62 is formed by performing ion implanting on the back surface 23 of the semiconductor substrate 10. As the forming method, the ion implanting is performed on the entire surface of the first collector region 61 using a P type dopant such as boron. Thereafter, the ion implanting using the P type dopant is performed once more while covering the second collector region 62 with a resist or the like. Thus, the doping concentration of the first collector region 61 can be made higher than the doping concentration of the second collector region 62.

A position X1 is a boundary position between the active region 110 and the inactive region 120 in the X axis direction. The position X1 is a position of the end at which the emitter electrode 52 is electrically connected with the front surface 21 of the semiconductor substrate 10. In the present example, the boundary position between the first collector region 61 and the second collector region 62 may be different from the position X1.

The position X2 is a boundary position between the edge region 122 and the intermediate region 124 in the X axis direction. The position X2 is a position of the end of the gate metal layer 50 on the negative side in the X axis direction. The position X2 is provided closer to the outer peripheral end 11 of the semiconductor substrate 10 than the position X1.

A position X3 is a boundary position between the first collector region 61 and the second collector region 62 in the X axis direction. The position X3 is provided between the position X1 and the position X2 in the X axis direction. The boundary position between the active region 110 and the inactive region 120 may match with the boundary position between the first collector region 61 and the second collector region 62. In this case, the position X1 is at the same position as the position X3.

A guard ring portion 92 is a region of the second conductivity type provided above the drift region 18 in the edge region 122. In the present example, the guard ring portion 92 is formed to have the same doping concentration as the doping concentration of the second collector region 62. The guard ring portion 92 is formed to surround the intermediate region 124 in the top plan view. The guard ring portion 92 serves to expand the depletion layer from the intermediate region 124 in the X axis direction. Moreover, by arranging a plurality of guard ring portions 92, the depletion layer can be expanded further in the X axis direction. Thus, by providing the plurality of guard ring portions 92, the breakdown voltage of the edge region 122 can be determined. The plurality of guard ring portions 92 may be spaced from each other. The edge region 122 in the present example has four guard ring portions 92-1 to 92-4.

A field plate electrode 80 may be provided above the guard ring portion 92. A plurality of field plate electrodes 80 and connecting portions 84 may be formed above the semiconductor substrate 10 in the edge region 122. Four field plate electrodes 80-1 to 80-4 and connecting portions 84-1 to 84-4 are correspondingly provided above the guard ring portions 92-1 to 92-4, respectively. Each connecting portion 84 may be provided to extend beyond the corresponding guard ring portion 92 or each connecting portion 84 may be provided to extend beyond the corresponding field plate electrode 80 in the X axis direction. The field plate electrode 80 in the present example is electrically connected with the guard ring portion 92 via the barrier metal layer 53 and the connecting portion 84. The field plate electrode 80 may be formed in the same process as the gate metal layer 50 and the emitter electrode 52. Moreover, the connecting portion 84 may be formed of polysilicon, and be formed in the same process as the gate conductive portion 44 of the gate trench portion 40 and the dummy conductive portion 34 of the dummy trench portion 30.

The connecting portion 84 is covered with the dielectric film 86. In the dielectric film 86, a contact hole for connecting the connecting portion 84 and the guard ring portion 92 and a contact hole for connecting the field plate electrode 80 and the connecting portion 84 are provided.

The barrier metal layer 53 electrically connects the field plate electrode 80 with the guard ring portion 92 at the contact hole. The barrier metal layer 53 is formed of titanium or titanium compound or the like. For example, the barrier metal layer 53 is a laminated film of Ti and TiN. Note that the plug 57 formed of tungsten or the like may be provided in the contact hole via the barrier metal layer 53.

A channel stopper region 94 is provided closer to the outer peripheral end 11 of the semiconductor substrate 10 than the guard ring portion 92, above the drift region 18 in the edge region 122. The channel stopper region 94 is a region of the N+ type or the P+ type. Above the channel stopper region 94, a channel stopper electrode 82 may be formed via the dielectric film 86.

The channel stopper electrode 82 is provided above the channel stopper region 94. The channel stopper electrode 82 is electrically connected with the channel stopper region 94 via the contact hole provided in the dielectric film 86. The channel stopper electrode 82 may be electrically connected with the channel stopper region 94 via the barrier metal layer 53. Moreover, the contact hole may include the plug 57 formed of tungsten or the like via the barrier metal layer 53, by which the channel stopper electrode 82 may be electrically connected with the channel stopper region 94. The channel stopper electrode 82 may be provided to extend in the X axis direction from the outer peripheral end 11 to a region where the channel stopper region 94 is not provided. The channel stopper electrode 82 may be formed in the same process as the gate metal layer 50 and the emitter electrode 52.

A protective film 88 covers the field plate electrode, the channel stopper electrode, the dielectric film 86, and the emitter electrode 52, above the semiconductor substrate 10. A partial region of the emitter electrode 52 may be exposed through the protective film 88 for connecting with a bonding wire or the like. Moreover, at an upper portion 28 of the outer peripheral end 11 side of the semiconductor substrate 10, the channel stopper region 94 is exposed through the protective film 88.

Herein, the doping concentration of the first collector region 61 is higher than the doping concentration of the second collector region 62. When the doping concentration of the second collector region 62 is higher than the doping concentration of the first collector region 61, electrons are amplified because of increased electron holes, so that the concentration in the drift region 18 is increased. Therefore, the breakdown voltage is lowered compared to that in a case where the doping concentration of the second collector region 62 is lower than the doping concentration of the first collector region 61. The breakdown voltage in the active region 110 can be made relatively lower than the breakdown voltage in the edge region 122. The breakdown voltage herein means a voltage value calculated from the integrated value of the electric field by which, in a state where a voltage of the reverse bias relative to the p-n junction between the base region 14 and the drift region 18 is applied to the semiconductor device when the semiconductor device in an OFF state, the maximum electric field strength of silicon is exceeded to cause avalanche breakdown. Thus, the avalanche breakdown can be caused earlier in the active region 110 than in the edge region 122.

Figure 4A:
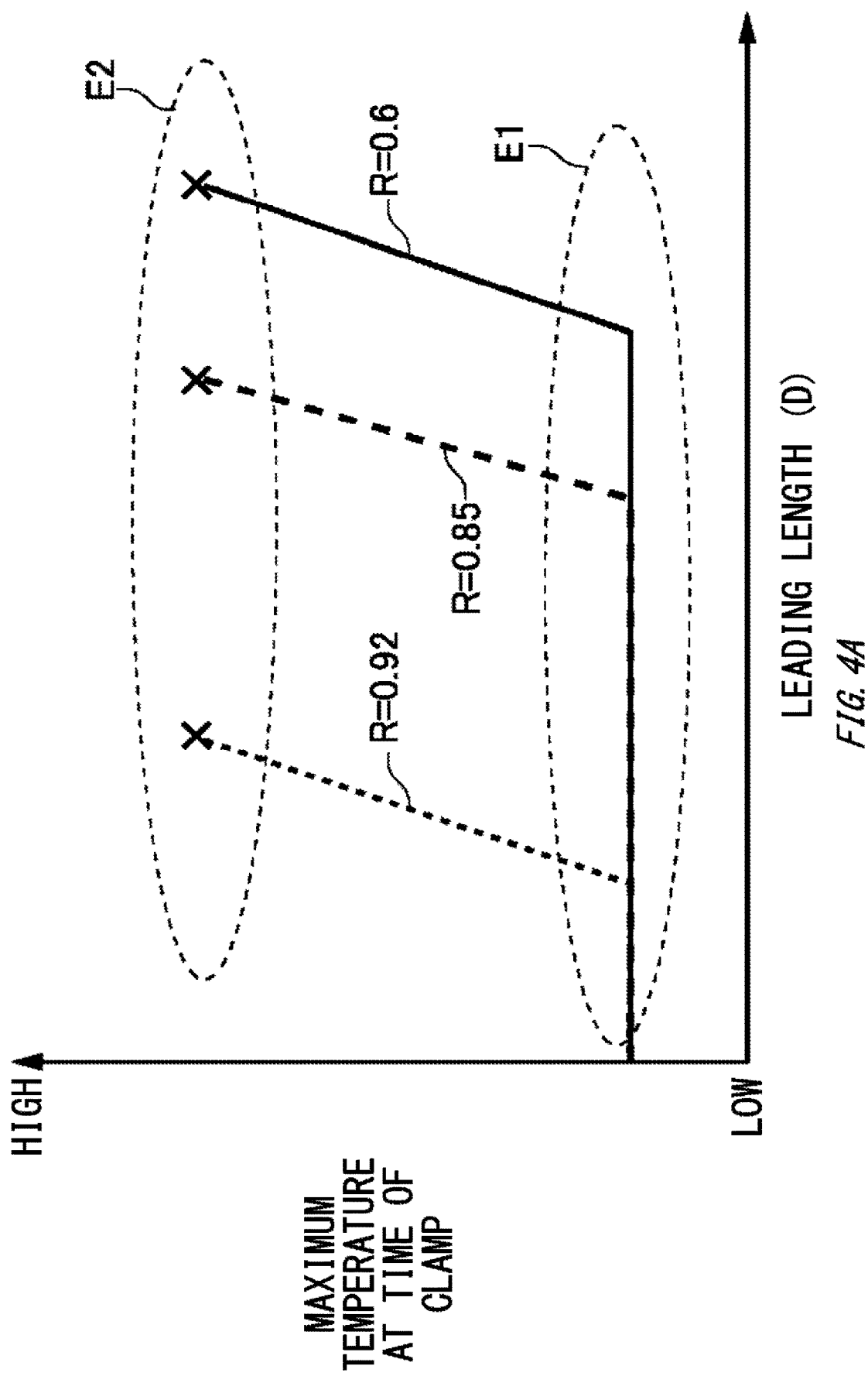
FIG. 4A shows a relationship between a leading length (D) and the temperature.
Figure 4B:
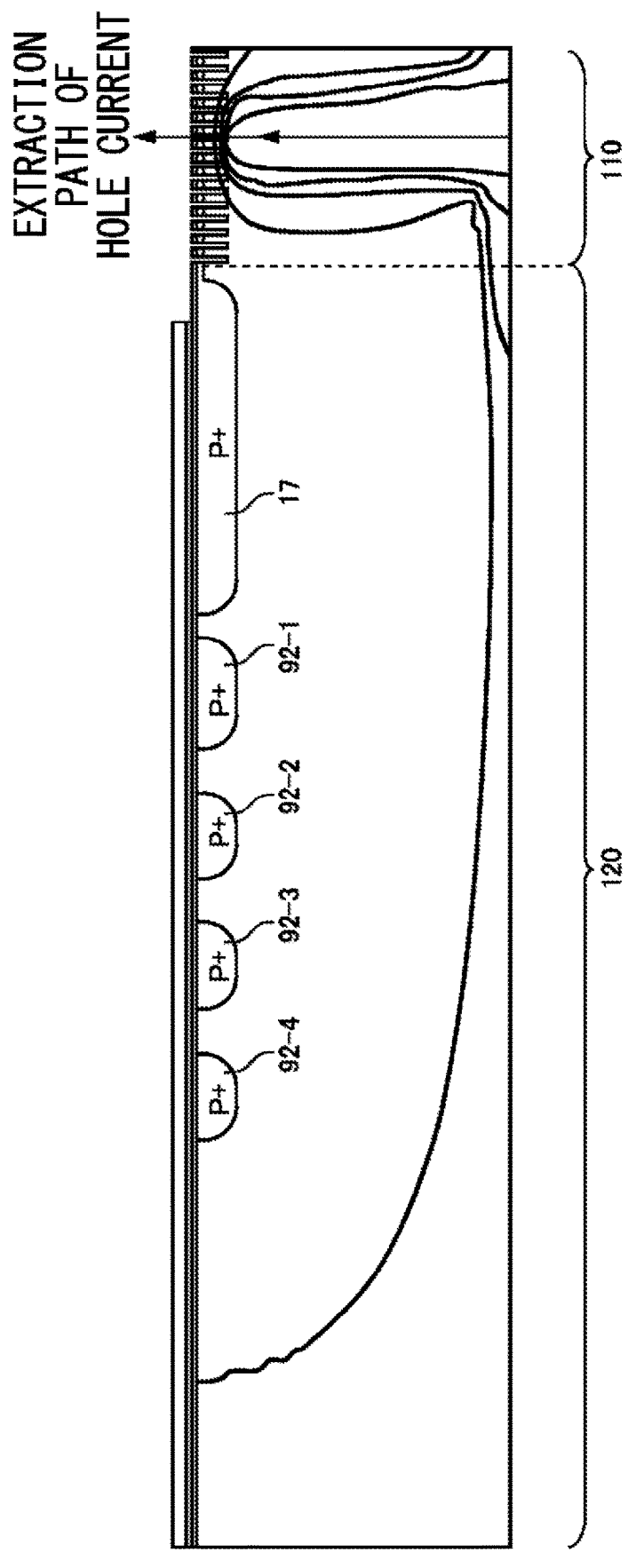
FIG. 4B shows one example of a simulation result of the semiconductor device 100.

When the doping concentration of the first collector region 61 is higher than the doping concentration of the second collector region 62, the electric field is enhanced in the active region 110 at the bottom portions of the gate trench portion 40 and the dummy trench portion 30, as shown in FIG. 4B described below. Thus, the avalanche current occurs at the bottom portions of the gate trench portion 40 and the dummy trench portion 30. When the avalanche current reaches the first collector region 61, holes are generated because of conductivity modulation. The generated holes can be extracted in an extraction region of the front surface 21.

At this time, the avalanche current at the bottom portions of the gate trench portion 40 and the dummy trench portion 30 easily occurs in a region where the width or depth of the trenches of the gate trench portion 40 and the dummy trench portion 30 locally and slightly varies. In the region where the avalanche current has occurred, the temperature becomes higher, and therefore the resistance of the drift region 18 becomes higher. Thus, the avalanche current is suppressed, so that the breakdown voltage becomes higher.

Note that, in another region where the avalanche current of the active region 110 does not flow, the temperature is lower because there is no flow of the avalanche current, and therefore the breakdown voltage becomes lower.

The avalanche current transits toward a region having a low temperature, and, in the region to which the avalanche current has transited, the temperature becomes higher. In the active region 110, the avalanche current flows by repeatedly transiting between regions. Therefore, because the avalanche current continues to move through the bottom portions of the gate trench portion 40 and the dummy trench portion 30, the rise of the temperature in the active region 110 is suppressed, so that device destruction due to overvoltage becomes unlikely to happen.

On the other hand, when the doping concentration of the first collector region 61 is lower than the doping concentration of the second collector region 62, the avalanche current occurs in the edge region 122 at the corner portion of the well region 17 on the guard ring portion 92 side. When the avalanche current reaches the second collector region 62, holes are generated. These holes can be extracted from the emitter electrode 52 of the active region 110 through the well region 17. Heat is generated by the distance the holes moves from the well region 17 to the emitter electrode 52, and therefore the temperature becomes higher. As a result, the device breaks before the occurrence region of the avalanche current transits. As a result, when the doping concentration of the first collector region 61 is higher than the doping concentration of the second collector region 62, turn-off withstand capability (in other words, breakdown withstand capability at the time of dynamic avalanche) is improved.

In particular, when the semiconductor device 100 is miniaturized and the pitch of the trench portion is made smaller, the breakdown voltage of the active region 110 becomes higher. In this case, if the area of the edge region 122 is reduced to relatively reduce the cost or the thickness of the semiconductor substrate 10 is thinned to improve its characteristic, the breakdown voltage of the edge region 122 becomes relatively low and therefore the avalanche breakdown easily occurs in the edge region 122. Thus, the turn-off withstand capability (in other words, the breakdown withstand capability at the time of the dynamic avalanche) of the semiconductor device 100 may be lowered.

According to the semiconductor device 100 in the present example, where the first collector region 61 has a higher doping concentration than that of the second collector region 62, the avalanche capability can be improved because the breakdown voltage of the active region 110 is relatively lower than that of the inactive region 120 even if the area of the edge region 122 is reduced or the thickness of the semiconductor substrate 10 is thinned.

Note that, by providing the accumulation region 16, the carrier concentration below the accumulation region 16 can be made higher to lower the ON voltage. Moreover, by providing the accumulation region 16, the breakdown voltage in the active region 110 can be relatively lowered to further improve the turn-off withstand capability (in other words, the breakdown withstand capability at the time of the dynamic avalanche), compared to a case where the accumulation region 16 is not provided. Note that the semiconductor device 100 may not include the accumulation region 16.

A width A is the distance from the outer peripheral end 11 of the semiconductor substrate 10 to the end of the gate metal layer 50. The width A can be enlarged to expand the depletion layer in the X direction from the well region 17 of the intermediate region 124 by increasing the number of the guard ring portions 92. However, when the width A is excessively enlarged, the area of the semiconductor device 100 itself becomes larger. As a result, the cost will be increased because the number of the semiconductor device 100 that can be provided in one semiconductor wafer is reduced. Therefore, the width A in the present example is 120 μm or more and 300 μm or less.

A width B is the distance from the outer peripheral end 11 of the semiconductor substrate 10 to the position X3 at the end of the second collector region 62. The width B may be larger than the width A. When the width B is larger than the width A, the difference B-A indicates the leading length of the second collector region 62 from the edge region 122. For example, the leading length may be 10 μm or more. The avalanche current in the edge region 122 occurs from the position X1 in the well region 17 of the intermediate region 124. Therefore, when the difference B-A becomes smaller (in other words, the position X3 is closer to the edge region 122), the breakdown voltage of each of the edge region 122 and the active region 110 is determined by the position X3 of the first collector region 61. As the difference B-A becomes smaller (in other words, the position X3 is closer to the edge region 122), the breakdown voltage of the edge region 122 becomes higher than the breakdown voltage of the active region 110. Thus, the breakdown voltage of the semiconductor device 100 becomes the breakdown voltage of the edge region 122, and the turn-off withstand capability (in other words, the breakdown withstand capability at the time of the dynamic avalanche) becomes lower.

A width C is the distance from the outer peripheral end 11 of the semiconductor substrate 10 to the end of the contact hole for electrically connecting the emitter electrode 52 and the front surface 21 of the semiconductor substrate 10.

The leading length D is the length by which the first collector region 61 extends on the inactive region 120 side beyond the active region 110. The leading length D is the difference between the width C and the width B. By enlarging the leading length D, the breakdown voltage in the active region 110 can be relatively lowered easily to improve the withstand capability.

The doping concentration of the second collector region 62 may be 0.85 times or more and 0.9 times or less of the doping concentration of the first collector region 61. In this case, by making the width B larger than the width A and making the difference between the width B and the width A larger than 10 µm, the breakdown voltage of the edge region 122 is less easily lowered than that of the active region 110.

Moreover, the thickness T of the semiconductor substrate 10 in the Z axis direction (in other words, the depth direction) satisfies B−A<αT, where α is defined as 0.1<α<0.5. For example, the thickness T of the semiconductor substrate 10 in the depth direction may be 50 µm or more, or may be 60 µm or more. Moreover, the thickness T of the semiconductor substrate 10 in the depth direction may be 650 µm or less.

Figure 3A:
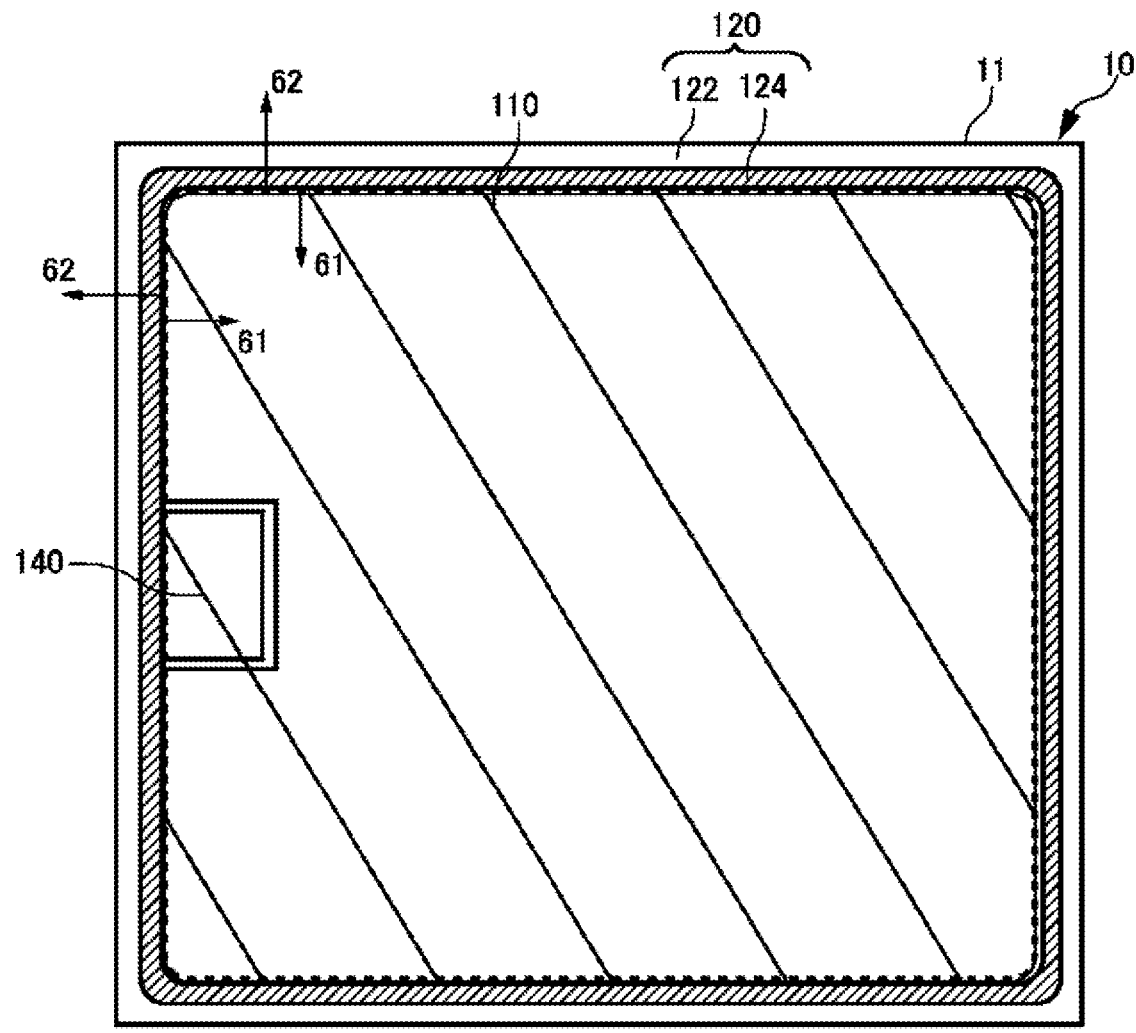
FIG. 3A shows a region where a first collector region 61 is formed, in the top plan view of the semiconductor device 100.

FIG. 3A shows a region where the first collector region 61 is formed in the top plan view of the semiconductor device 100. The first collector region 61 in the present example is provided in a region inside the gate metal layer 50. The first collector region 61 is provided along the gate metal layer 50. The gate pad 140 is in contact with the gate metal layer 50, and the gate pad 140 is provided from the intermediate region 124 through the active region 110. The first collector region 61 in the present example is provided at a lower part of the gate pad 140. In the top plan view, the area S1 of the first collector region 61 is of the same size as the area S2 of the second collector region 62 or larger than the area S2 of the second collector region 62. Therefore, the breakdown voltage in the active region 110 can be relatively lowered easily to improve the withstand capability.

Figure 3B:
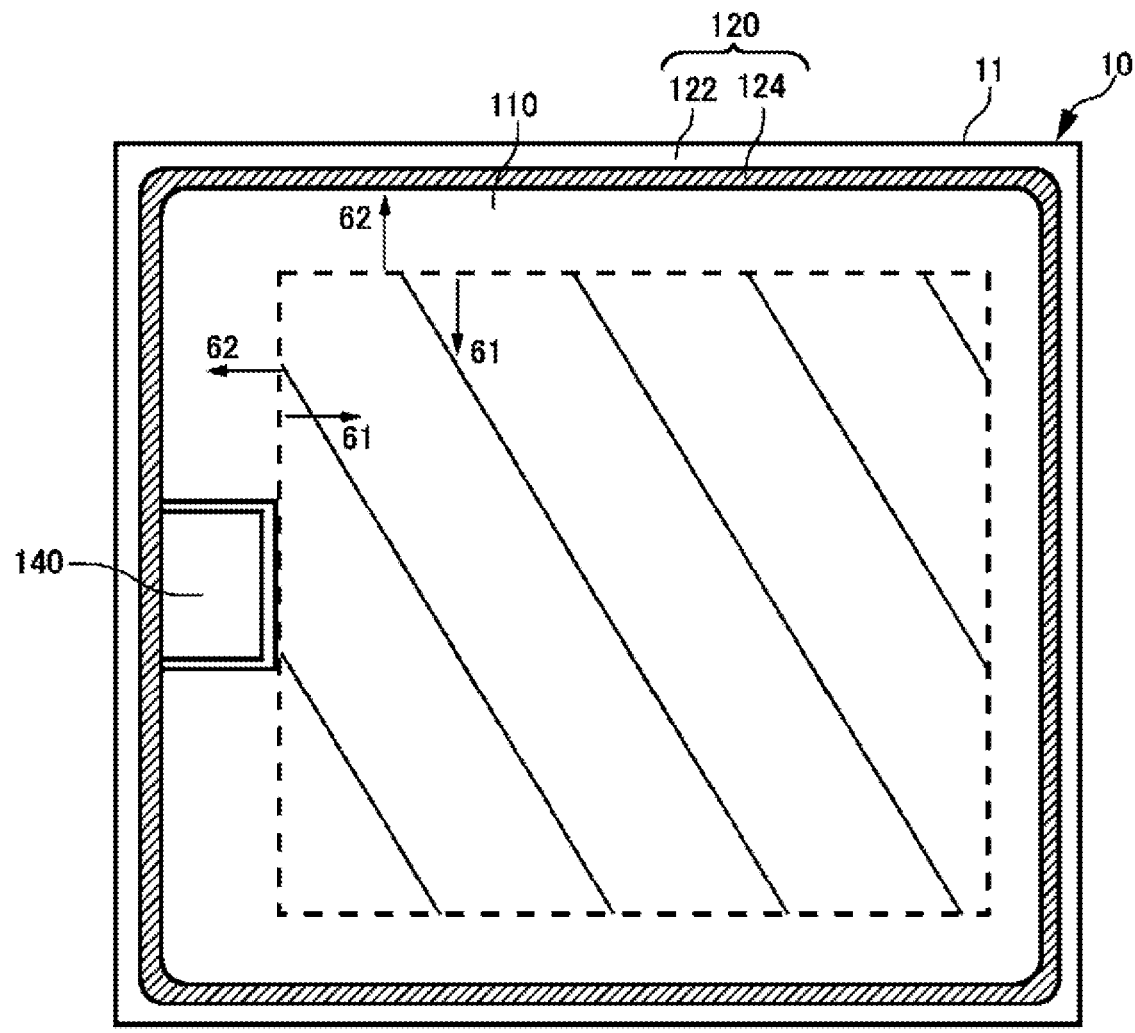
FIG. 3B shows a region where the first collector region 61 is formed, in the top plan view of the semiconductor device 100.

FIG. 3B shows a region where the first collector region 61 is formed, in the top plan view of the semiconductor device 100. The first collector region 61 in the present example is provided inside the active region 110, in the top plan view. The first collector region 61 in the present example has a rectangular shape in the top plan view, but it is not limited thereto. The first collector region 61 in the present example is not provided in the inactive region 120. Even in this case, the area S1 of the first collector region 61 is of the same size as the area S2 of the second collector region 62 or larger than the area S2 of the second collector region 62, in the top plan view.

Figure 3C:
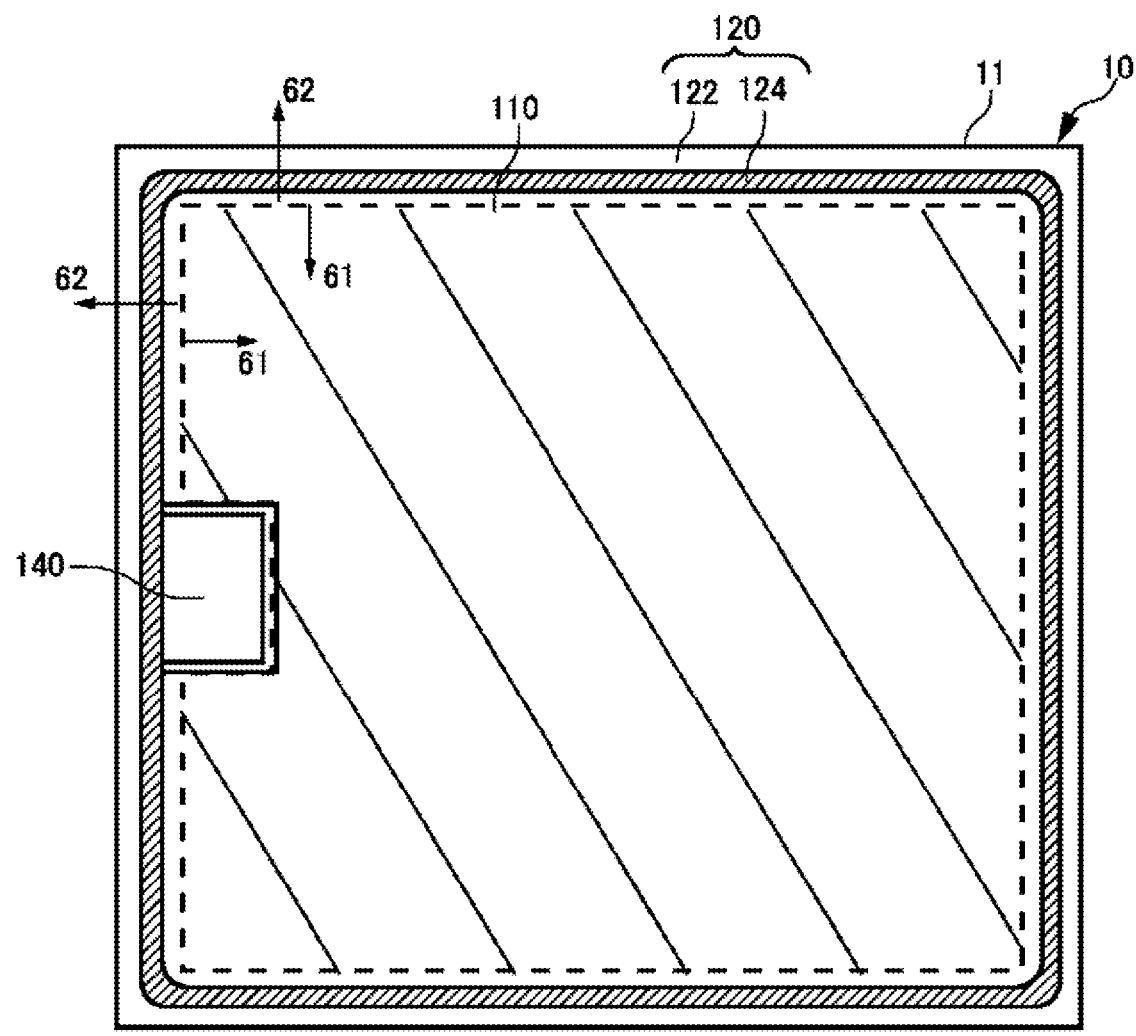
FIG. 3C shows a region where the first collector region 61 is formed, in the top plan view of the semiconductor device 100.

FIG. 3C shows a region where the first collector region 61 is formed in the top plan view of the semiconductor device 100. The first collector region 61 in the present example is provided inside the active region 110, in the top plan view. The first collector region 61 in the present example is provided along the active region 110. In the region inside the gate metal layer 50, the first collector region 61 is provided in a region other than the region where the gate pad 140 is provided. Even in this case, in the top plan view, the area S1 of the first collector region 61 is of the same size as the area S2 of the second collector region 62 or larger than the area S2 of the second collector region 62.

FIG. 4A shows a relationship between the leading length D and the temperature. The longitudinal axis indicates the maximum temperature in the interior of the semiconductor device 100 when the voltage is clamped, and the horizontal axis indicates the leading length D of the first collector region 61. The concentration ratio of the second collector region 62 to the first collector region 61 is different in each graph.

The concentration ratio R indicates the ratio of the doping concentration of the second collector region 62 to the doping concentration of the first collector region 61. When R=0.92, the doping concentration of the second collector region 62 is 0.92 times of the doping concentration of the first collector region 61. The above description also applies to R=0.85 and R=0.6.

Figure 5A:
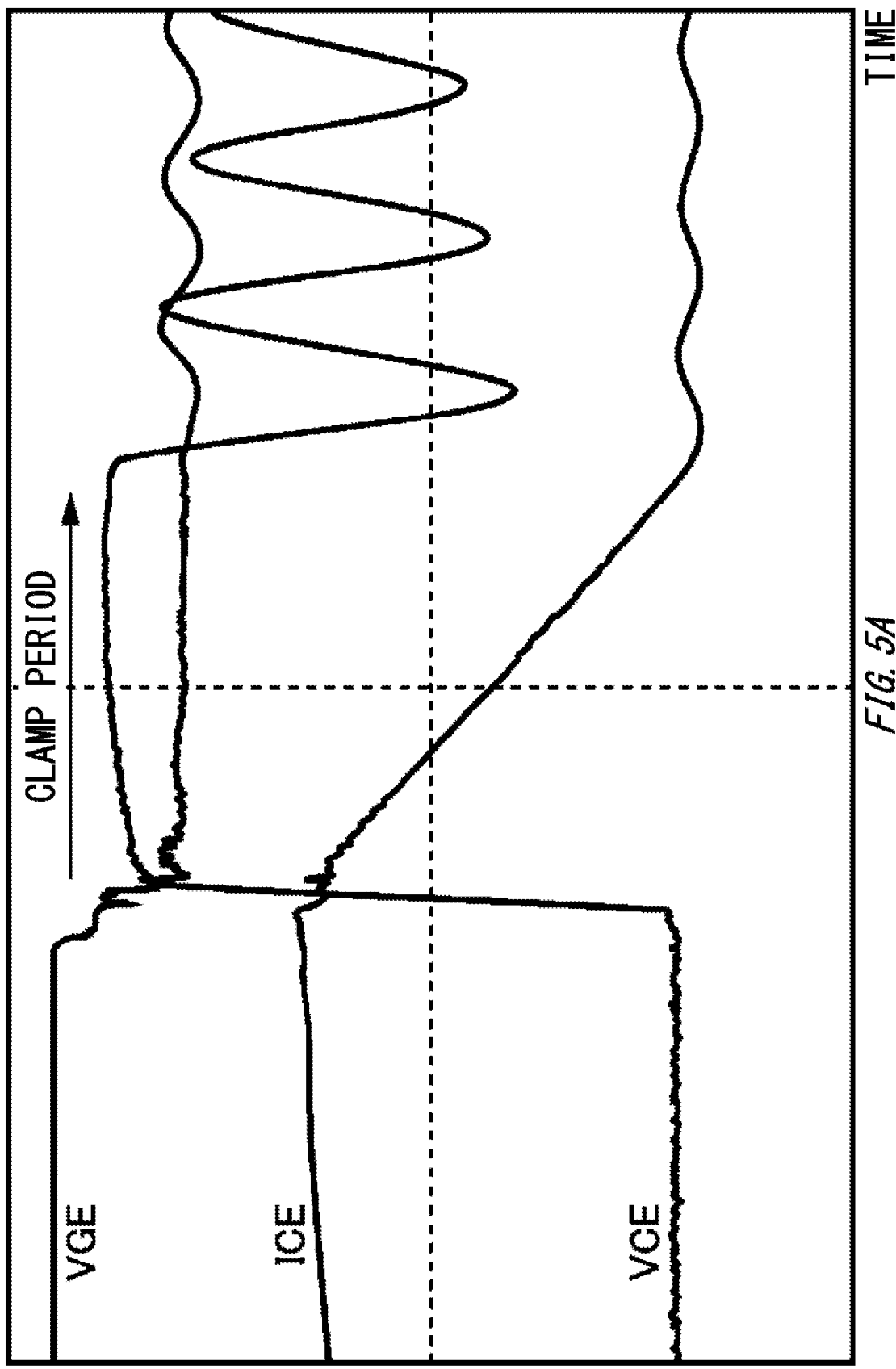
FIG. 5A shows one example of a characteristic of the semiconductor device 100.

A region E1 is a region where the maximum temperature at the time of clamp is low, and is a temperature region where the avalanche current is determined by the active region 110. A region E2 is a region where the maximum temperature at the time of clamp is higher than the region E1, and is a temperature region where the avalanche current is determined by the edge region 122. The clamp refers to a state where the collector voltage VCE rises and becomes constant at the time of turning off as shown in FIG. 5A described below.

FIG. 4B shows one example of a simulation result of the semiconductor device 100. FIG. 4B shows an internal state when the doping concentration of the first collector region 61 is set to 8E17 cm$^{-3}$ and the doping concentration of the second collector region 62 is set to 6E17 cm$^{-3}$.

By making the first collector region 61 having a higher doping concentration than the second collector region 62, the avalanche current easily occurs in the active region 110. As a result, the breakdown voltage in the active region 110 becomes the breakdown voltage of the semiconductor device 100. Because the temperature when the avalanche current occurs is within the region E1 of FIG. 4A, the temperature does not abruptly rise and therefore the device destruction is unlikely to happen. Note that, when the avalanche current eventually transits to the edge portion and the temperature rises to the region E2, the destruction of the semiconductor device 100 may happen.

Figure 4C:
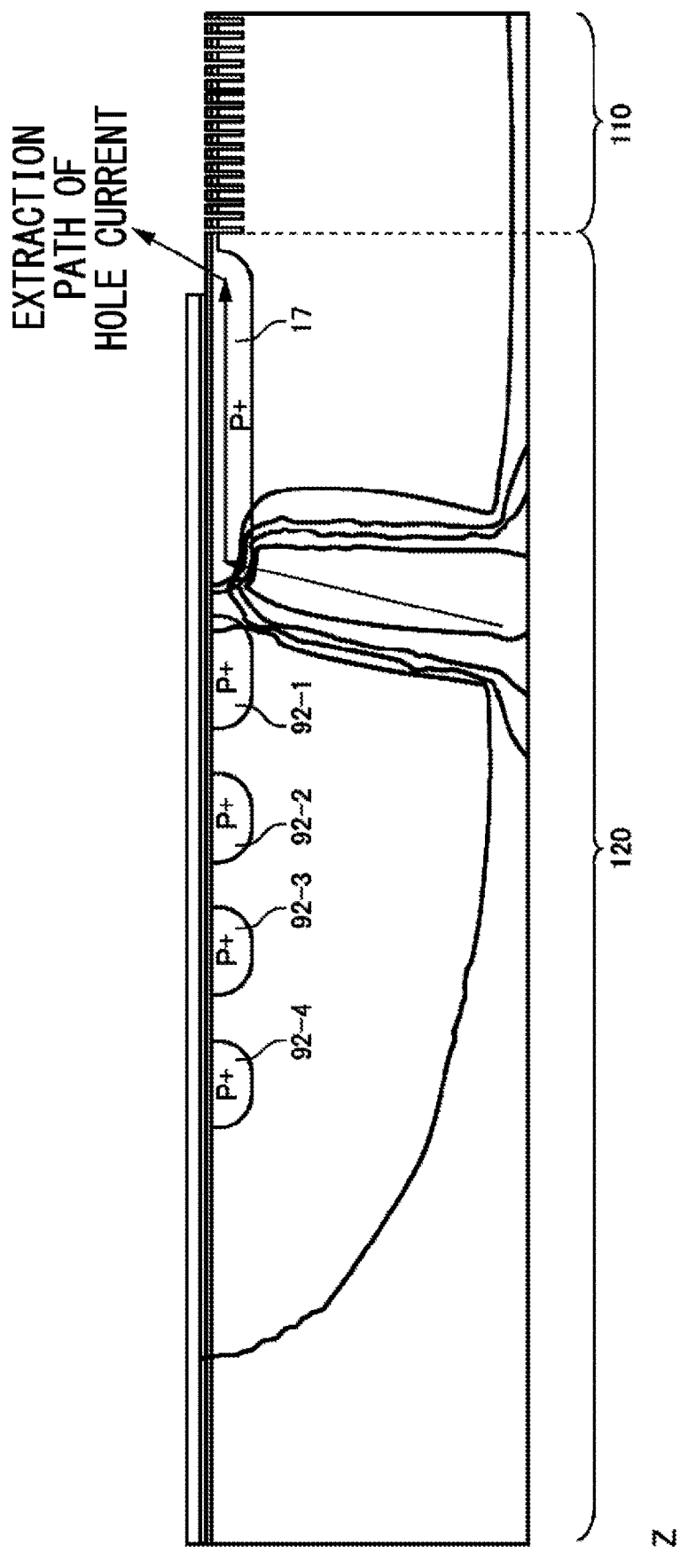
FIG. 4C shows one example of a simulation result of a semiconductor device according to a comparative example.

FIG. 4C shows one example of a simulation result of the semiconductor device according to a comparative example. FIG. 4C shows an internal state when the doping concentration of each of the first collector region 61 and the second collector region 62 is set to 6E17 cm$^{-3}$.

By setting the doping concentration of the first collector region 61 and the doping concentration of the second collector region 62 to be the same, the avalanche current easily occurs in the edge region 122. As a result, the breakdown voltage of the edge region 122 becomes the breakdown voltage of the semiconductor device of the comparative example. The avalanche current occurs at the corner portion of the well region 17 on the guard ring portion 92 side. When the avalanche current occurs, the temperature abruptly rises to the region E2 of FIG. 4A. Therefore, when the avalanche current flows, the temperature abruptly rises to cause destruction of the semiconductor device.

The condition concerning R and the leading length D shown in FIG. 4A is described below. When R=0.92, the leading length D of the first collector region 61 is set to 10 µm or more. Moreover, when R=0.85, the leading length D of the first collector region 61 is set to 40 µm or less.

FIG. 5A shows one example of a characteristic of the semiconductor device 100. Graphs in the present example respectively indicates a waveform of the gate voltage VGE, a waveform of the collector voltage VCE, and a waveform of the collector current ICE, when wiring inductance of around 10 to 20 pH is connected. When the semiconductor device 100 in the present example includes the first collector region 61 having a higher doping concentration than that of the second collector region 62, the clamp period is extended. Therefore, device destruction due to overvoltage is unlikely to happen.

In the semiconductor device 100 of the present example, in which the doping concentration of the first collector region 61 is higher than that of the second collector region 62, the hole density is increased in the back surface 23 so that the electron density from the front surface 21 is increased. Therefore, in the active region 110, because the electron density of the drift region 18 is increased at the time when the waveform of the collector voltage VCE shown in FIG. 5A is clamped to be constant, the expansion of the depletion layer is suppressed so that the breakdown voltage at the time of clamp is lowered. As a result, the avalanche current easily occurs in the active region 110 and the withstand capability is improved.

Figure 5B:
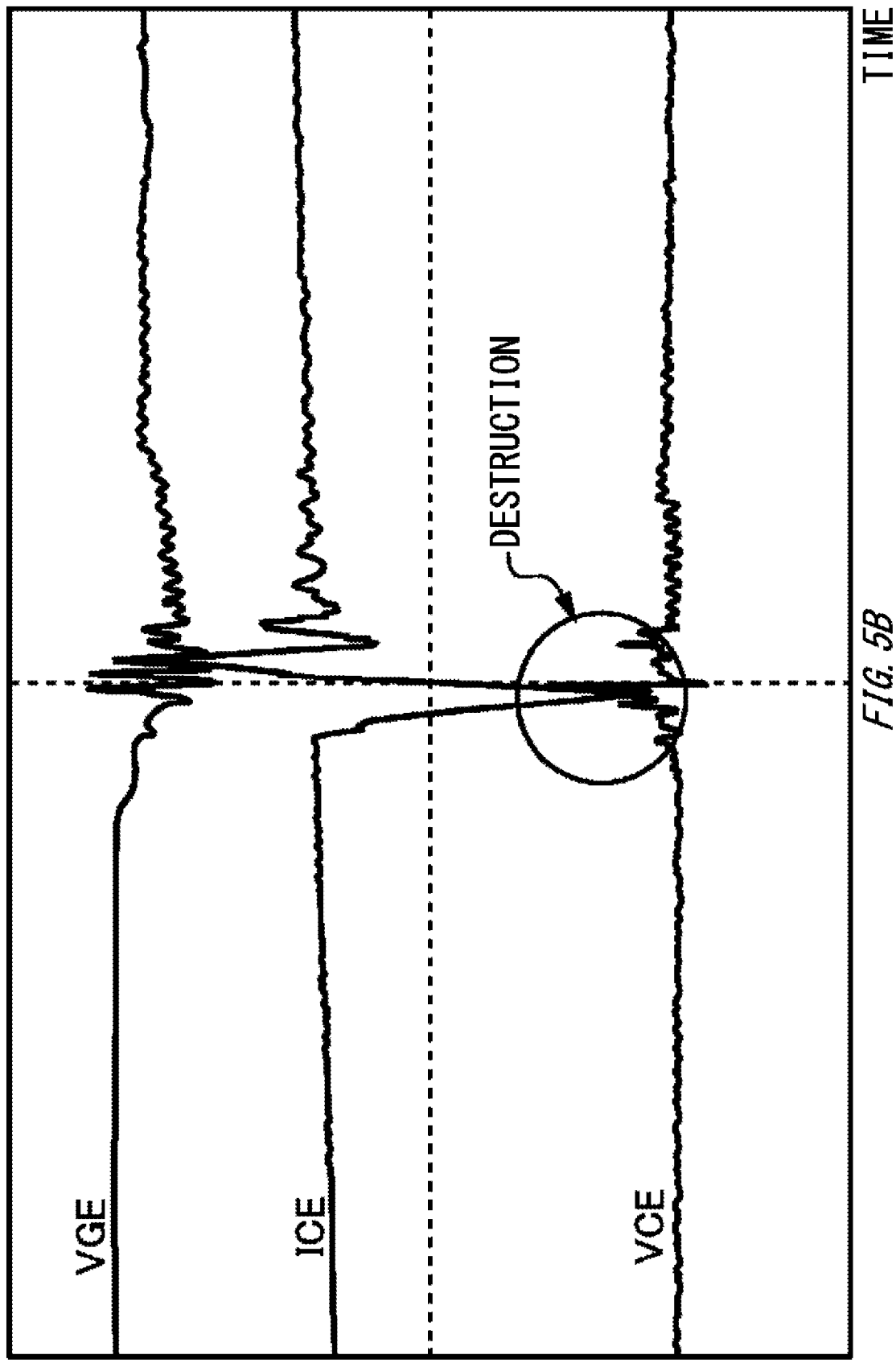
FIG. 5B shows one example of a characteristic of the semiconductor device according to a comparative example.

FIG. 5B shows one example of a characteristic of the semiconductor device according to a comparative example. In the semiconductor device of the comparative example, the collector region has no gradient in the doping concentration and the doping concentration is uniform. Therefore, in the semiconductor device of the comparative example, when the avalanche current occurs in the edge region, the semiconductor device 100 breaks due to the increased temperature. In FIG. 5B, the semiconductor device 100 breaks when the wiring inductance is further increased.

While the embodiments of the present invention have been described, the technical scope of the invention is not limited to the above described embodiments. It is apparent to persons skilled in the art that various alterations or improvements can be added to the above described embodiments. It is also apparent from the scope of the claims that the embodiments added with such alterations or improvements can be included in the technical scope of the invention.

EXPLANATION OF REFERENCES

10: semiconductor substrate, 11: outer peripheral end, 12: emitter region, 14: base region, 15: contact region, 16: accumulation region, 17: well region, 18: drift region, 20: buffer region, 21: front surface, 23: back surface, 24: collector electrode, 25: connecting portion, 28: upper portion, 29: end, 30: dummy trench portion, 31: extending portion, 32: dummy dielectric film, 34: dummy conductive portion, 38: interlayer dielectric film, 40: gate trench portion, 41: extending portion, 42: gate dielectric film, 43: connecting portion, 44: gate conductive portion, 50: gate metal layer, 52: emitter electrode, 53: barrier metal layer, 54: contact hole, 55: contact hole, 56: contact hole, 57: plug, 61: first collector region, 62: second collector region, 71: mesa portion, 80: field plate electrode, 82: channel stopper electrode, 84: connecting portion, 86: dielectric film, 88: protective film, 92: guard ring portion, 94: channel stopper region, 100: semiconductor device, 110: active region, 120: inactive region, 122: edge region, 124: intermediate region, 140: gate pad

What is claimed is:

1. A semiconductor device comprising an active region and an edge region, the semiconductor device comprising:
   a drift region of a first conductivity type provided in a semiconductor substrate;
   a base region of a second conductivity type provided above the drift region;
   a first collector region of the second conductivity type provided below the drift region in the active region; and
   a second collector region of the second conductivity type provided below the drift region in the edge region,
   wherein a doping concentration of the first collector region is higher than a doping concentration of the second collector region,
   wherein an area of the first collector region is of the same size as an area of the second collector region or larger than the area of the second collector region, in a top plan view.

2. The semiconductor device according to claim 1, wherein the doping concentration of the first collector region is $1E16$ $cm^{-3}$ or more and $5E18$ $cm^{-3}$ or less.

3. The semiconductor device according to claim 2, comprising an intermediate region provided between the active region and the edge region, in the top plan view,
   wherein the first collector region is provided to extend from the active region to the intermediate region, in the top plan view.

4. The semiconductor device according to claim 2, wherein the first collector region is provided inside the active region, in the top plan view.

5. The semiconductor device according to claim 2, comprising:
   an emitter electrode provided above the semiconductor substrate and electrically connected with a front surface of the semiconductor substrate; and
   a gate metal layer provided above the semiconductor substrate for setting a gate potential,
   wherein a width B that is a distance from an outer peripheral end of the semiconductor substrate to an end of the second collector region is larger than a width A that is a distance from the outer peripheral end of the semiconductor substrate to an end of the gate metal layer.

6. The semiconductor device according to claim 2, comprising:
   a guard ring portion of the second conductivity type provided above the drift region in the edge region; and
   a channel stopper region provided closer to the outer peripheral end of the semiconductor substrate than the guard ring portion, above the drift region in the edge region.

7. The semiconductor device according to claim 1, wherein the doping concentration of the second collector region is $1E16$ $cm^{-3}$ or more and $5E18$ $cm^{-3}$ or less.

8. The semiconductor device according to claim 2, wherein the doping concentration of the second collector region is $1E16$ $cm^{-3}$ or more and $5E18$ $cm^{-3}$ or less.

9. The semiconductor device according to claim 7, comprising an intermediate region provided between the active region and the edge region, in the top plan view,
   wherein the first collector region is provided to extend from the active region to the intermediate region, in the top plan view.

10. The semiconductor device according to claim 7, wherein the first collector region is provided inside the active region, in the top plan view.

11. The semiconductor device according to claim 7, comprising:
    an emitter electrode provided above the semiconductor substrate and electrically connected with a front surface of the semiconductor substrate; and
    a gate metal layer provided above the semiconductor substrate for setting a gate potential,
    wherein a width B that is a distance from an outer peripheral end of the semiconductor substrate to an end of the second collector region is larger than a width A that is a distance from the outer peripheral end of the semiconductor substrate to an end of the gate metal layer.

12. The semiconductor device according to claim 1, comprising an intermediate region provided between the active region and the edge region, in the top plan view,
    wherein the first collector region is provided to extend from the active region to the intermediate region, in the top plan view.

13. The semiconductor device according to claim 1, wherein the first collector region is provided inside the active region, in the top plan view.

14. The semiconductor device according to claim 1, comprising:
- an emitter electrode provided above the semiconductor substrate and electrically connected with a front surface of the semiconductor substrate; and
- a gate metal layer provided above the semiconductor substrate for setting a gate potential,
- wherein a width B that is a distance from an outer peripheral end of the semiconductor substrate to an end of the second collector region is larger than a width A that is a distance from the outer peripheral end of the semiconductor substrate to an end of the gate metal layer.

15. The semiconductor device according to claim 14, wherein the doping concentration of the second collector region is 0.85 times or less of the doping concentration of the first collector region.

16. The semiconductor device according to claim 15, wherein a thickness T of the semiconductor substrate in a depth direction satisfies $B-A<\alpha T$, where $0.1<\alpha<0.5$.

17. The semiconductor device according to claim 14, wherein the difference between the width B and the width A is larger than 10 μm.

18. The semiconductor device according to claim 17, wherein the doping concentration of the second collector region is 0.85 times or more and 0.9 times or less of the doping concentration of the first collector region.

19. The semiconductor device according to claim 14, wherein a thickness T of the semiconductor substrate in a depth direction satisfies $B-A<\alpha T$, where $0.1<\alpha<0.5$.

20. The semiconductor device according to claim 1, comprising:
- a guard ring portion of the second conductivity type provided above the drift region in the edge region; and
- a channel stopper region provided closer to the outer peripheral end of the semiconductor substrate than the guard ring portion, above the drift region in the edge region.

* * * * *